US011145711B2

(12) United States Patent
Ashimine et al.

(10) Patent No.: US 11,145,711 B2
(45) Date of Patent: Oct. 12, 2021

(54) CAPACITOR AND METHOD FOR MANUFACTURING CAPACITOR

(71) Applicant: Murata Manufacturing Co., Ltd., Nagaokakyo (JP)

(72) Inventors: Tomoyuki Ashimine, Nagaokakyo (JP); Hiroshi Nakagawa, Nagaokakyo (JP); Yasuhiro Murase, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 64 days.

(21) Appl. No.: 16/546,556

(22) Filed: Aug. 21, 2019

(65) Prior Publication Data

US 2019/0378893 A1   Dec. 12, 2019

Related U.S. Application Data

(63) Continuation of application No. PCT/JP2018/016465, filed on Apr. 23, 2018.

(30) Foreign Application Priority Data

May 16, 2017   (JP) .............. JP2017-097057

(51) Int. Cl.
*H01L 49/02* (2006.01)
*H01G 4/33* (2006.01)
(Continued)

(52) U.S. Cl.
CPC .............. *H01L 28/92* (2013.01); *H01G 4/33* (2013.01); *H01L 21/0217* (2013.01);
(Continued)

(58) Field of Classification Search
CPC .............. H01L 28/92; H01L 21/30604; H01L 21/0217; H01L 21/784; H01L 21/28525;
(Continued)

(56) References Cited

U.S. PATENT DOCUMENTS 6,573,157 B1   6/2003   Sato
6,794,746 B2   9/2004   Sato
(Continued)

FOREIGN PATENT DOCUMENTS

JP   S61115332 A   6/1986
JP   H03283637 A   12/1991
(Continued)

OTHER PUBLICATIONS

International Search Report issued in PCT/JP2018/016465, dated Jul. 3, 2018.
(Continued)

*Primary Examiner* — Arun Ramaswamy
(74) *Attorney, Agent, or Firm* — Arent Fox LLP

(57) ABSTRACT

A capacitor that includes a substrate having a principal surface; a dielectric film on the principal surface of the substrate; and an electrode layer on the dielectric film. The substrate has a recess structure portion with at least one recess portion in a second region outside a first region where the electrode layer overlaps the dielectric layer when viewed in a plan view from a normal direction of the principal surface of the substrate, and the dielectric film is on the recess structure portion.

15 Claims, 12 Drawing Sheets

(51) Int. Cl.
*H01L 21/02* (2006.01)
*H01L 21/285* (2006.01)
*H01L 21/306* (2006.01)
*H01L 21/3065* (2006.01)
*H01L 21/321* (2006.01)
*H01L 21/784* (2006.01)
*H01L 21/3213* (2006.01)

(52) U.S. Cl.
CPC .. *H01L 21/02271* (2013.01); *H01L 21/28525* (2013.01); *H01L 21/3065* (2013.01); *H01L 21/30604* (2013.01); *H01L 21/32135* (2013.01); *H01L 21/784* (2013.01)

(58) Field of Classification Search
CPC ........... H01L 21/3065; H01L 21/02271; H01L 21/32135; H01G 4/33
USPC .................. 257/301, 302, 303, 520; 361/303
See application file for complete search history.

(56) References Cited

U.S. PATENT DOCUMENTS

| | | | |
|---|---|---|---|
| 8,330,247 B2* | 12/2012 | Marenco | H01L 29/945 |
| | | | 257/520 |
| 2003/0197764 A1 | 10/2003 | Sato | |
| 2016/0079248 A1* | 3/2016 | Basker | H01L 27/10879 |
| | | | 257/347 |
| 2016/0087028 A1 | 3/2016 | Hirota et al. | |
| 2016/0247879 A1* | 8/2016 | Dosev | H01L 29/0692 |
| 2016/0276471 A1* | 9/2016 | Hernandez Guillen | |
| | | | H01L 29/045 |

FOREIGN PATENT DOCUMENTS

| | | |
|---|---|---|
| JP | 2005353657 A | 12/2005 |
| JP | 2014229680 A | 12/2014 |
| WO | 0059050 A1 | 10/2000 |

OTHER PUBLICATIONS

Written Opinion of the International Searching Authority issued in PCT/JP2018/016465, dated Jul. 3, 2018.

* cited by examiner

CAPACITOR AND METHOD FOR MANUFACTURING CAPACITOR

CROSS REFERENCE TO RELATED APPLICATIONS

The present application is a continuation of International application No. PCT/JP2018/016465, filed Apr. 23, 2018, which claims priority to Japanese Patent Application No. 2017-097057, filed May 16, 2017, the entire contents of each of which are incorporated herein by reference.

FIELD OF THE INVENTION

The present invention relates to a capacitor and a method for manufacturing a capacitor.

BACKGROUND OF THE INVENTION

As a typical capacitor element used in a semiconductor integrated circuit, for example, an MIM (Metal Insulator Metal) capacitor is well known. The MIM capacitor is a capacitor having a structure in which a dielectric film is sandwiched between a lower electrode and an upper electrode. In order to apply the capacitor element to a high-voltage power device or to mount the capacitor element on a high-density electronic component, the capacitor element is required to have a high withstand voltage and a large capacitance. As a method of realizing such an MIM capacitor having a high withstand voltage, for example, a thickness of a dielectric film has been studied.

However, in the case where the MIM capacitor is provided on the substrate by PVD (Physical Vapor Deposition) or CVD (Chemical Vapor Deposition), as the film thickness of the dielectric film increases, the thermal stress on the dielectric film increases due to the difference in thermal expansion coefficients between the substrate and the dielectric film, and the dielectric film tends to crack.

A crack generated in the dielectric film causes a decrease in the capacitance value due to a leak current and an operation failure due to a short circuit. For example, Patent Document 1 discloses a semiconductor device having a capacitor including a lower electrode disposed on a semiconductor substrate, a second protective film, a dielectric film having a defect extending in the film thickness direction from an upper surface facing the second protective film, a third protective film having at least a defect buried film made of an insulator having the defect buried therein, a first protective film covering the dielectric film and the third protective film, and an upper electrode covering the first protective film. In this semiconductor device, by burying defects (cracks) in the dielectric film of the capacitor, generation of minority defects caused by leakage current is avoided.

Patent Document 1: Japanese Patent Application Laid-Open No. 2014-229680

SUMMARY OF THE INVENTION

However, the defects buried in the semiconductor device described in Patent Document 1 are cracks caused by volume shrinkage of the dielectric film during crystal growth. Since the protective film on the semiconductor substrate is thickened by providing the defect buried film, it is difficult to prevent the occurrence of cracks caused by thermal stress due to the thermal expansion coefficient between the semiconductor substrate and the protective film.

The present invention has been made in view of such circumstances, and an object of the present invention is to provide a capacitor capable of improving reliability.

A capacitor according to one aspect of the present invention includes a substrate having a principal surface and a recess structure portion with at least one recess portion; a dielectric film on the recess structure portion and the principal surface of the substrate; and an electrode layer on the dielectric film, the electrode layer being located such that the at least one recess portion is in a second region outside a first region where the electrode layer overlaps the dielectric layer when viewed in a plan view from a normal direction of the principal surface of the substrate.

A method for manufacturing a capacitor according to another aspect of the present invention includes: preparing an aggregate substrate having a principal surface and having a plurality of first regions and a second region between the plurality of first regions when viewed in a plan view from a normal direction of the principal surface; forming a recess structure portion with at least one recess portion in the second region; providing a dielectric film on the aggregate substrate in the plurality of first regions and the recess structure portion; providing an electrode layer on the dielectric film in the plurality of first regions; and singulating the plurality of first regions by cutting the aggregate substrate in the second region.

According to the present invention, it is possible to provide a capacitor with improved reliability.

DETAILED DESCRIPTION OF THE INVENTION

Figure 1:
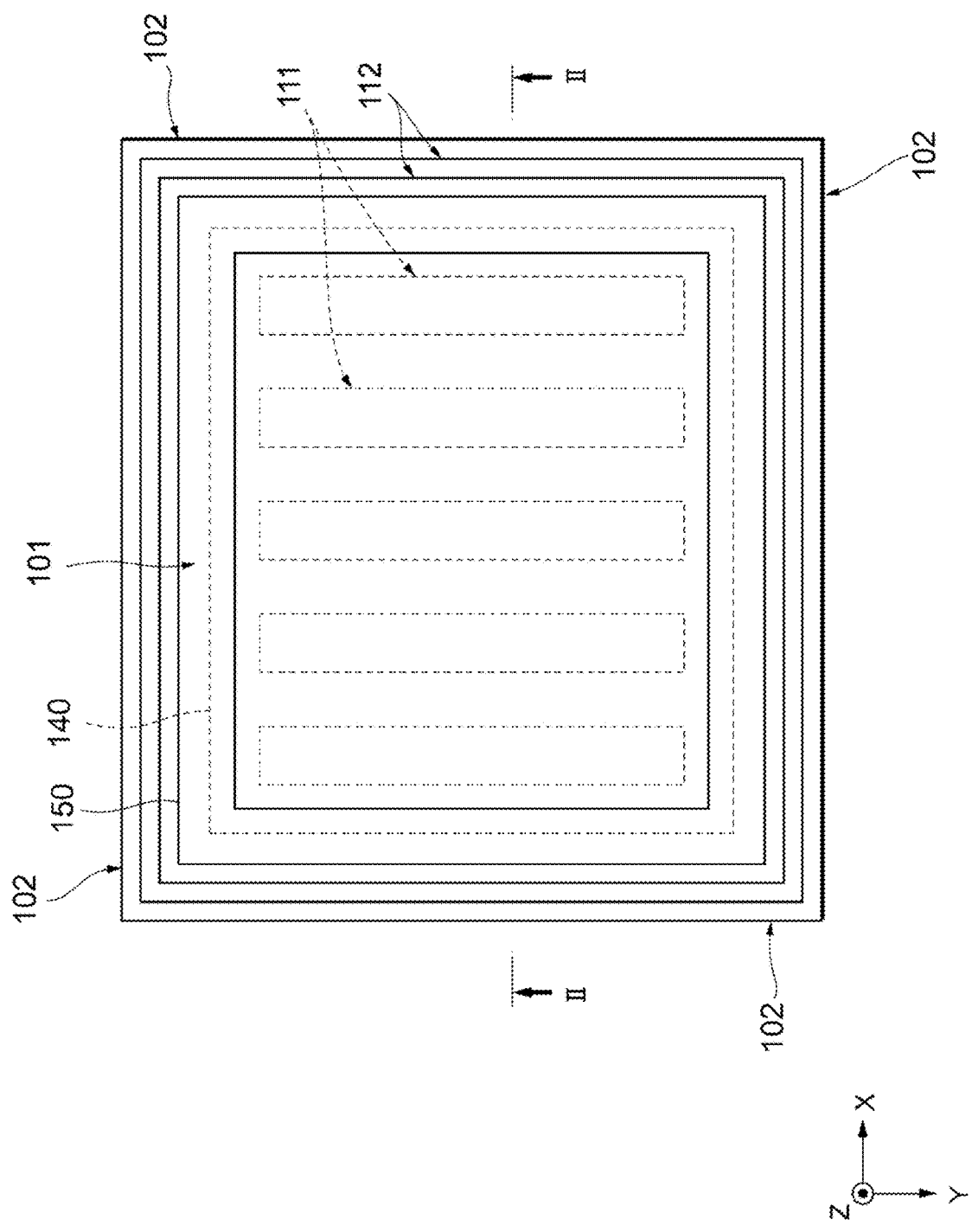
FIG. 1 is a plan view schematically showing a configuration of a capacitor according to a first embodiment.

Hereinafter, embodiments of the present invention will be described with reference to the drawings. Note that, in the second and subsequent embodiments, components that are identical or similar to those of the first embodiment are denoted by the identical or similar reference numerals as those of the first embodiment, and detailed description thereof will be omitted as appropriate. Further, with respect to the effects obtained in the second and subsequent embodiments, description of the same effects as those in the first embodiment will be appropriately omitted. The drawings of the embodiments are illustrative, the dimensions and shapes of the respective portions are schematic, and the technical scope of the present invention should not be limited to the embodiments.

First Embodiment

Figure 2:
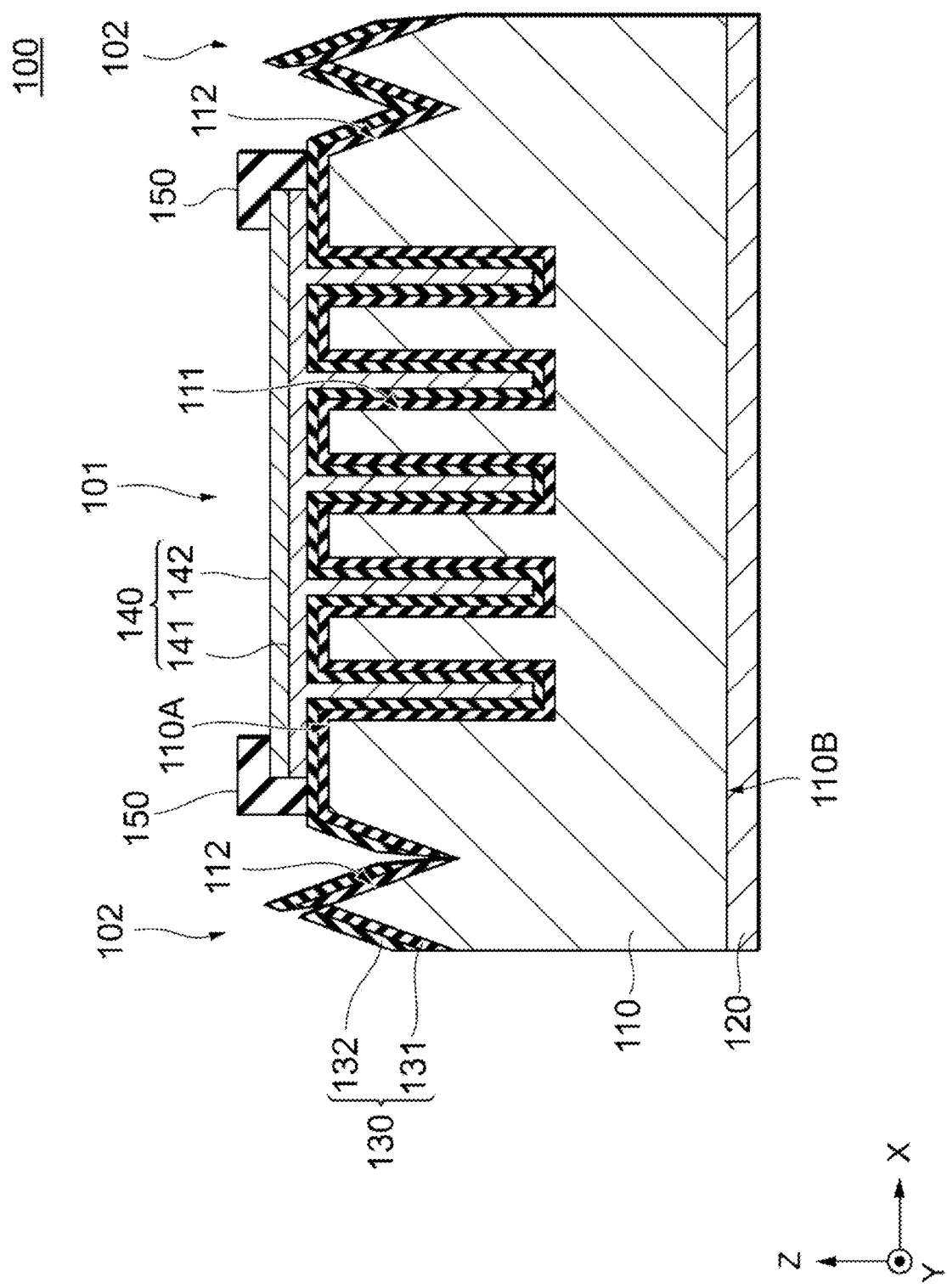
FIG. 2 is a sectional view schematically showing a configuration of a cross section of the capacitor shown in FIG. 1 along line II-II.
Figure 3:
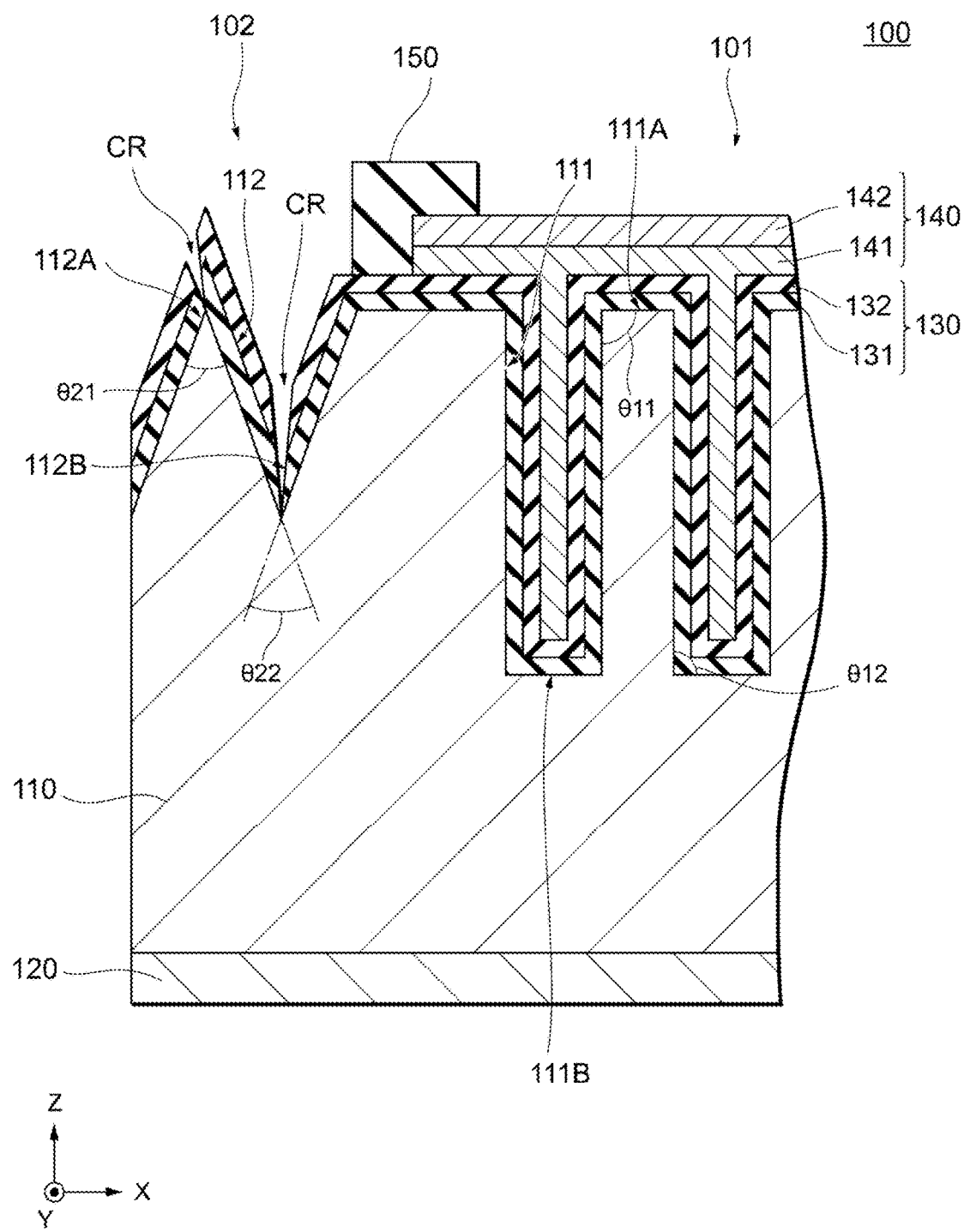
FIG. 3 is an enlarged sectional view of the capacitor section shown in FIG. 2.

First, the configuration of a capacitor 100 according to the first embodiment of the present invention will be described with reference to FIGS. 1 to 3. FIG. 1 is a plan view schematically showing the configuration of a capacitor according to the first embodiment. FIG. 2 is a sectional view schematically showing the configuration of a cross section of the capacitor shown in FIG. 1 along line II-II. FIG. 3 is an enlarged sectional view of the capacitor section shown in FIG. 2.

A first direction X, a second direction Y, and a third direction Z shown in the drawings are directions orthogonal to one another for example, but they are not limited to these directions as long as they intersect one another, and they may intersect one another at angles other than 90°. The first direction X, the second direction Y, and the third direction Z are not limited to the direction (positive direction) of the arrow shown in FIG. 1, but include the direction (negative direction) opposite to the arrow.

The capacitor 100 includes a substrate 110, a first electrode layer 120, a dielectric film 130, a second electrode layer 140, and an insulating film 150. The capacitor 100 has a first portion 101 and a second portion 102 positioned outside the first portion 101 when viewed in a plan view from the normal direction of a first principal surface 110A of the substrate 110. The first portion 101 is a region in which the first electrode layer 120 and the second electrode layer 140 overlap each other across the dielectric film 130, and corresponds to a capacitance forming portion for forming a capacitance. The second portion 102 corresponds to a stress concentration portion for concentrating thermal stress applied to the dielectric film 130. The second portion 102 is provided in a frame shape so as to surround the first portion 101, for example.

The substrate 110 has, for example, a single-layer structure composed of a low-resistance silicon substrate having conductivity. The substrate 110 may be an insulating substrate such as quartz crystal. The substrate 110 may have a multilayer structure, for example, it may be a laminate composed of a conductive substrate and an insulating film. The first principal surface 110A is provided on the positive direction side in the third direction Z, and the second principal surface 110B is provided on the negative direction side in the third direction Z. The first principal surface 110A is a crystal plane whose crystal orientation is expressed as <100>, for example. The first principal surface 110A and the second principal surface 110B are surfaces parallel to a plane specified by the first direction X and the second direction Y (hereinafter referred to as an "XY plane"). In the substrate 110, for example, a trench structure portion 111 and a recess structure portion 112 are formed on the first principal surface 110A side.

The trench structure portion 111 is a concavo-convex structure formed in the first portion 101, and has a plurality of recess portions 111B and a plurality of protrusion portions 111A. The recess portion 111B is recessed toward the negative direction side in the third direction Z from the first principal surface 110A. The recess portion 111B is formed in a groove shape having a bottom surface of a predetermined width. The recess portions 111B extend in the second direction Y and are aligned in the first direction X. The protrusion portion 111A is positioned between the recess portions 111B and protrudes from the recess portions 111B toward the positive direction side in the third direction Z. The protrusion portion 111A has a top surface of a predetermined width. The top surface of the protrusion portion 111A is included in the first principal surface 110A, for example. The depth of the recess portion 111B of the trench structure portion 111 in the third direction Z (position of the bottom surface of the recess portion 111B with respect to the top surface of the protrusion portion 111A) is, for example, 10 μm to 50 μm. The width of the recess portion 111B of the trench structure portion 111 in the first direction X is, for example, about 5 μm, and the width of the protrusion portion 111A in the first direction X is, for example, about 5 μm.

The corner of the protrusion portion 111A of the trench structure portion 111 has an angle θ11 on the substrate 110 side. The corner of the recess portion 111B of the trench structure portion 111 has an angle θ12 on a space side surrounded by the trench structure portion 111, i.e., on the opposite side to the substrate 110. The angle θ11 is an angle formed by the top surface and the side surface of the protrusion portion 111A of the trench structure portion 111, and the angle θ12 is an angle formed by the bottom surface and the side surface of the recess portion 111B of the trench structure portion 111. For example, the angles θ11 and θ12 are each approximately 90 degrees. The bottom surface of the trench structure portion 111 may have a curved shape. In this case, the angle θ12 may be larger than 90°. When the protrusion portion 111A of the trench structure portion 111 has a plurality of surfaces and has a plurality of angles formed by the surfaces, the angle θ11 indicates the largest angle among the angles formed on the protrusion portion 111A. The angle θ12 similarly indicates the largest angle formed in the recess portion 111B. In this case, the angle ell may be greater than 90°, and the angle θ12 may also be greater than 90°.

As an example, the trench structure portion 111 constituted with the 5 recess portions 111B is shown, but the trench structure portion 111 only needs to have at least one recess portion 111B, and the number of recess portions 111B and protrusion portions 111A is not particularly limited. Further, when viewed in a plan view from the normal direction of the first principal surface 110A, the shape of the recess portion 111B is not limited to a groove shape, but may be formed in an island shape, for example, a circular (ellipse) non-through hole arranged in a matrix shape. The trench structure portion 111 may be formed on the second principal surface 110B side. That is, the trench structure portion 111 and the recess structure portion 112 may be formed on different principal surfaces of the substrate 110. The trench structure portion 111 may be formed on both the first principal surface 110A side and the second principal surface 110B side.

As shown in FIG. 2, when the first principal surface 110A of the substrate 110 is viewed in a plan view, the trench structure portion 111 is provided inside the second electrode layer 140 and overlaps a part of the second electrode layer 140. According to this, since the entire trench structure portion 111 contributes to the formation of the capacitance, the capacitance of the capacitor 100 can be increased. However, the trench structure portion 111 may be provided from the inside to the outside of the second electrode layer 140. This can increase the creepage distance between the end portion of the first electrode layer 120 and the end portion of the second electrode layer 140. Accordingly, generation of creeping discharge in the capacitor 100 can be suppressed. The creepage distance is a distance along the surface of the insulating member such as the substrate 110 and the dielectric film 130, which exist between the first electrode layer 120 and the second electrode layer 130.

The shape of the first portion 101 is not limited as long as a capacitance can be formed, and the trench structure portion 111 may be omitted. That is, for example, the dielectric film 130 and the second electrode layer 140 may be provided on the flat first principal surface 110A of the first portion 101 so as to be parallel to the XY plane. The bottom surface of the recess portion 111B or the top surface of the protrusion portion 111A may have a polygonal shape composed of a plurality of surfaces, a shape bent toward the third direction Z, or a combination thereof.

The recess structure portion 112 is a concave-convex structure formed on the second portion 102, and has a recess portion 112B and a protrusion portion 112A. The recess portion 112B is recessed toward the negative direction side in the third direction Z from the first principal surface 110A. The recess portion 112B has a V-shaped cross section where two side surfaces adjacent to each other are connected at the bottom portion thereof, and is formed in a groove shape. The protrusion portion 112A has an inverted V-shaped cross section where two side surfaces adjacent to each other are connected at the top portion thereof. The protrusion portion 112A is positioned between the recess portions 112B and protrudes from the recess portions 112B toward the positive direction in the third direction Z. The top portion of the protrusion portion 112A is constituted with the first principal surface 110A, for example. The recess structure portion 112 is formed in a region outside the first portion 101, i.e., a region overlapping the second electrode layer 140 of the substrate 110 when viewed in a plan view from the normal direction of the first principal surface 110A. The recess portion 112B and the protrusion portion 112A are formed in a frame shape along the outer periphery of the first portion 101 so as to surround the trench structure portion 111.

The depth of the recess portion 112B of the recess structure portion 112 (position of the bottom portion of the recess portion 112B relative to the top portion of the protrusion portion 112A) is smaller than the depth of the recess portion 111B of the trench structure portion 111. This can increase the surface area of the trench structure portion 111 and can increase the capacitance formed in the first portion 101.

The corner of the protrusion portion 112A of the recess structure portion 112 has an angle $\theta 21$ on the substrate 110 side. The corner of the recess portion 112B of the recess structure portion 112 has an angle $\theta 22$ on the space side surrounded by the recess structure portion 112, i.e., on the opposite side to the substrate 110. The angle $\theta 21$ is an angle formed by two adjacent side surfaces of the protrusion portion 112A of the recess structure portion 112, and the angle $\theta 22$ is an angle formed by two adjacent side surfaces of the recess portion 112B of the recess structure portion 112. However, when the recess structure portion 112 has a top surface at the top portion of the protrusion portion 112A, the angle $\theta 21$ is an angle formed by the top surface and the side surface. When the recess structure portion 112 has a bottom surface at the bottom portion of the recess portion 112B, the angle $\theta 22$ is an angle formed by the bottom surface and the side surface. When the protrusion portion 112A of the recess structure portion 112 has a plurality of surfaces and has a plurality of angles formed by the surfaces, the angle $\theta 21$ indicates the largest angle among the angles formed on the protrusion portion 112A. The angle $\theta 22$ similarly indicates the largest angle formed in the recess portion 112A.

The angle $\theta 21$ is smaller than the angle $\theta 11$, and the angle $\theta 22$ is smaller than the angle $\theta 12$. The angles $\theta 21$ and $\theta 22$ are, for example, acute angles. The size of the angle $\theta 21$ is not particularly limited as long as it is smaller than the angle $\theta 11$, and it may be an obtuse angle or a right angle. The same applies to the size of the angle $\theta 22$. In other words, the first principal surface 110A side of the substrate 110 is flatter in the first portion 101 than in the second portion 102. If the first principal surface 110A side of the substrate 110 is flat in the first portion 101, i.e., if the trench structure portion 111 is omitted, the sizes of the angles $\theta 21$ and $\theta 22$ of the recess structure portion 112 can be freely designed. It is preferable that either the angle $\theta 21$ or the angle $\theta 22$ is smaller than the smaller one of the angle $\theta 11$ and the angle $\theta 12$. In other words, it is preferable that the minimum angle of the plurality of corners formed in the recess structure portion 112 is smaller than the minimum angle of the plurality of angles formed in the trench structure portion 111. At this time, the minimum angle of the recess structure portion 112 is the minimum angle of the angle formed on the substrate 110 side by the corner of the protrusion portion 112A and the angle formed on the opposite side to the substrate 110 by the corner of the recess portion 112B in the recess structure portion 112. The minimum angle of the trench structure portion 111 is the minimum angle of the angle formed on the substrate 110 side by the corner of the protrusion portion 111A and the angle formed on the opposite side to the substrate 110 by the corner of the recess portion 111B in the trench structure portion 111. Further, the recess structure portion 112 may have a structure in which stress is more concentrated than in a portion where stress is the most concentrated in the trench structure portion 111, and the relationship among the angle $\theta 11$, the angle $\theta 12$, the angle $\theta 21$, and the angle $\theta 22$ is not limited to this.

As an example, the recess structure portion 112 constituted with the two recess portions 112B and the one protrusion portion 112A is mentioned, but the recess structure portion 112 only needs to have at least one recess portion 112B, and the number of the recess portions 112B and the protrusion portions 112A is not particularly limited. The sectional shapes of the recess portion 112B and the protrusion portion 112A are not limited to a V-shape and an inverted V-shape, and may have a top surface and a bottom surface each having a predetermined width. The bottom portion of the recess portion 112B or the top portion of the protrusion portion 111A may have a polygonal shape composed of a plurality of surfaces, a shape bent toward the third direction Z, or a combination thereof. The recess structure portion 112 is not limited to a frame shape surrounding the first portion 101 when viewed in a plan view from the normal direction of the first principal surface 110A. The recess structure portion 112 may be formed discontinuously, e.g., the recess structure portion 112 may be formed so as to be adjacent to the first portion 101 only in one of the first direction X and the second direction Y, and not to be adjacent to the first portion 101 in the other direction.

As shown in FIG. 2, the recess structure portion 112 is provided outside the second electrode layer 130 when the first principal surface 110A of the substrate 110 is viewed in a plan view. This can increase the creepage distance between the end portion of the first electrode layer 120 and the end portion of the second electrode layer 130. Accordingly, generation of creeping discharge in the capacitor 100 can be suppressed.

The first electrode layer 120 covers the second principal surface 110B of the substrate 110. The first electrode layer 120 may be provided at least on the second principal surface 110B in the first portion 101. The first electrode layer 120 is formed of, for example, a metal material such as Mo (molybdenum), Al (aluminum), Au (gold), Ag (silver), Cu (copper), W (tungsten), Pt (platinum), Ti (titanium), Ni (nickel), Cr (chrome), or the like. The first electrode layer 120 is not limited to a metal material as long as it is a conductive material, and it may be formed of a conductive resin or the like. The first electrode layer 120 is not necessarily formed on the entire surface of the second principal surface 110B of the substrate 110, but it may be formed at least on the first portion 101. When the substrate 110 is a low-resistance silicon substrate, the first electrode layer 120 and the substrate 110 are electrically connected to each other and function as the lower electrode of the capacitor 100. If the substrate 110 is an insulating substrate, the substrate 110 functions as a part of the dielectric layer of the capacitor 100, and the first electrode layer 120 functions as the lower electrode.

The dielectric film 130 has a first dielectric layer 131 and a second dielectric layer 132. The first dielectric layer 131 covers the first principal surface 110A side of the substrate 110, and is provided also on the trench structure portion 111 and the recess structure portion 112. That is, the first dielectric layer 131 is provided continuously from above the first principal surface 110A of the substrate 110 to the inside of a space formed on the first principal surface 110A side of the substrate 110 by the trench structure portion 111 and the recess structure portion 112. The first dielectric layer 131 is formed of, for example, an insulating silicon oxide (e.g., $SiO_2$). The film thickness of the first dielectric layer 131 is about 0.3 µm, for example.

The second dielectric layer 132 is provided on the first dielectric layer 131. The second dielectric layer 132 is provided also inside a space formed on the first principal surface 110A side of the substrate 110 by the trench structure portion 111 and the recess structure portion 112. The second dielectric layer 132 is formed of, for instance, a silicon nitride-based dielectric material such as silicon oxynitride (SiON) or silicon nitride ($Si_3N_4$). The film thickness of the second dielectric layer 132 is about 1 µm, for example. Since the second dielectric layer 132 is formed of a dielectric having a dielectric constant higher than that of the first dielectric layer 131, the capacitance density of the capacitor 100 can be improved. The second dielectric layer 132 may have a laminated structure of a plurality of dielectrics in addition to a single layer. This makes it possible to design more arbitrary capacitance and withstand voltage. The second dielectric layer 132 is not limited to a silicon nitride-based dielectric material, and it may be formed of a dielectric material made of an oxide such as $Al_2O_3$, $HfO_2$, $Ta_2O_5$, or $ZrO_2$. The first dielectric layer 131 is not limited to a silicon oxide-based dielectric material, and it may be formed of another oxide or silicon nitride-based dielectric material.

In the dielectric film 130, a crack CR is formed in the second portion 102, i.e., in a portion provided on the recess structure portion 112. The crack CR is formed so as to integrally penetrate the first dielectric layer 131 and the second dielectric layer 132 from the top portion of the protrusion portion 112A or the bottom portion of the recess portion 112B, for example. However, the crack CR may be formed only in the first dielectric layer 131 or only in the second dielectric layer 132.

The film thickness of the dielectric film 130 is smaller than the depth and the width of the recess portion 111B of the trench structure portion 111. According to this, it is possible to avoid a situation in which the recess portion 111B of the trench structure portion 111 is filled with the dielectric film 130. That is, a decrease in the capacitance density of the capacitor 100 can be suppressed. The dielectric film 130 may have a single-layer structure as long as it can be formed with a sufficient film thickness (e.g., 1 µm or more).

The second electrode layer 140 is provided on the dielectric film 130 in the first portion 101, i.e., the portion overlapping the trench structure portion 111. The second electrode layer 140 is opposed to the first electrode layer 120 across the dielectric film 130. The second electrode layer 140 functions as an upper electrode of the capacitor 100 and forms a capacitance with the lower electrode (the substrate 110 and the first electrode layer 120).

The second electrode layer 140 has a first conductive layer 141 and a second conductive layer 142. The first conductive layer 141 is formed on the dielectric film 130, and is also provided inside a space formed on the first principal surface 110A side of the substrate 110 by the trench structure portion 111. The first conductive layer 141 is, for example, a p-type or n-type polycrystalline silicon (Poly-Si) film. The second conductive layer 142 is provided on the first conductive layer 141. The second conductive layer 142 is formed of, for example, a metal material mentioned in the description of the first electrode layer 120. The second conductive layer 142 is not limited to a metal material, and it may be formed of a conductive material such as a conductive resin.

The insulating film 150 covers the end portion of the second electrode layer 140 when viewed in a plan view from the normal direction of the first principal surface 110A of the substrate 110. The insulating film 150 is, for example, a polyimide (PI) film, but may be another organic insulating film or an inorganic insulating film such as silicon oxide or silicon nitride. The insulating film 150 can suppress the generation of a leakage current due to creeping discharge. That is, the capacitor 100 can have a high withstand voltage. If the dielectric constant of the insulating film 150 is larger than that of the dielectric film 130, the leakage electric field from the second electrode layer 140 can be suppressed. On the other hand, if the dielectric constant of the insulating film 150 is smaller than that of the dielectric film 130, the formation of the parasitic capacitance by the second electrode layer 140 can be suppressed.

Second Embodiment

As the second embodiment, a method for manufacturing a capacitor 200 will be described with reference to FIGS. 4 to 11. The second embodiment corresponds to the method for manufacturing the capacitor 100 according to the first embodiment. In the second embodiment described below, description of matters common to the first embodiment will be omitted and only differences will be described. In particular, no reference will be made one by one to the same actions and effects of the same configuration. The same reference numerals as those in the first embodiment denote the same structures and functions as those in the first embodiment.

Figure 4:
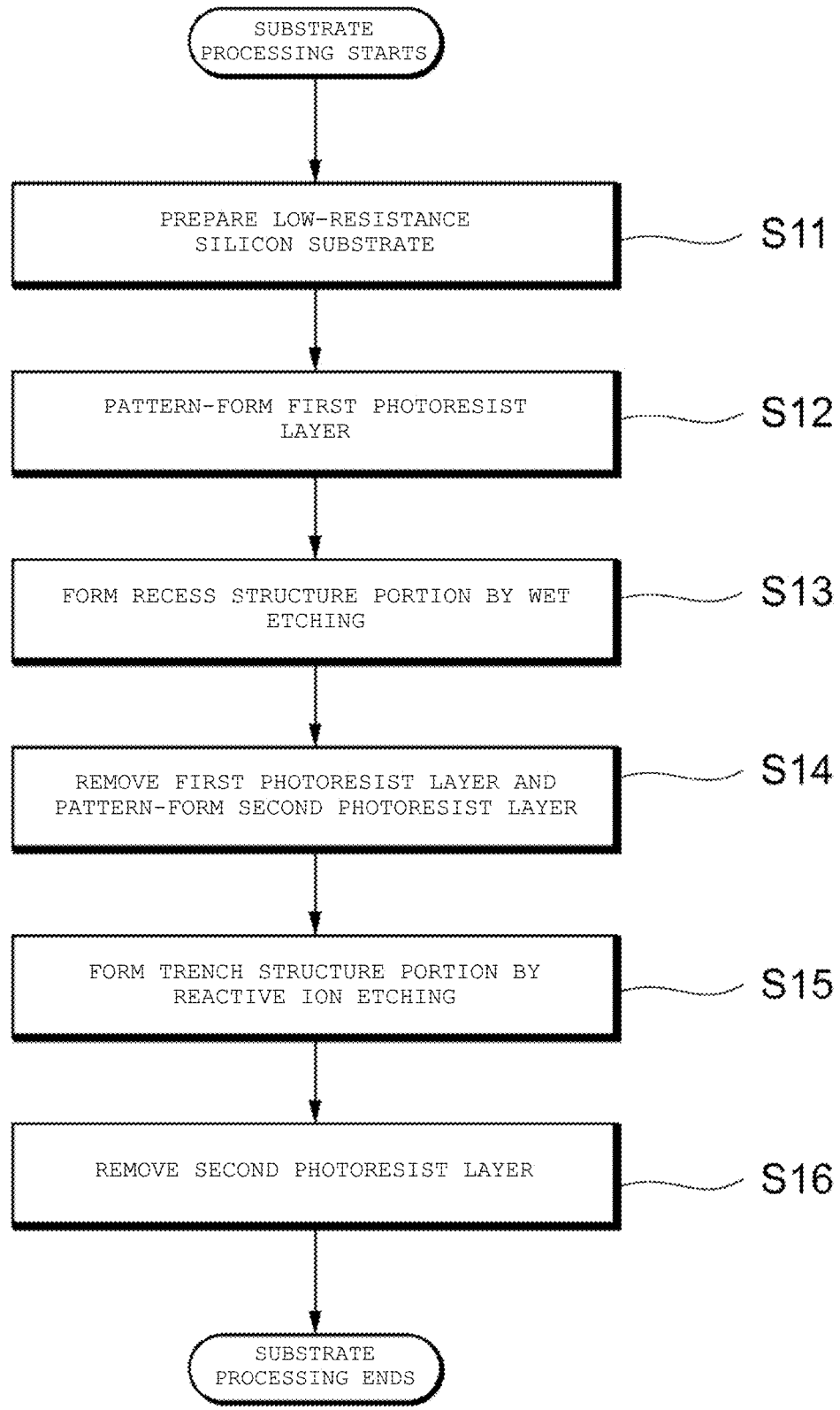
FIG. 4 is a flowchart showing a substrate processing step in a capacitor manufacturing method according to a second embodiment.
Figure 5:
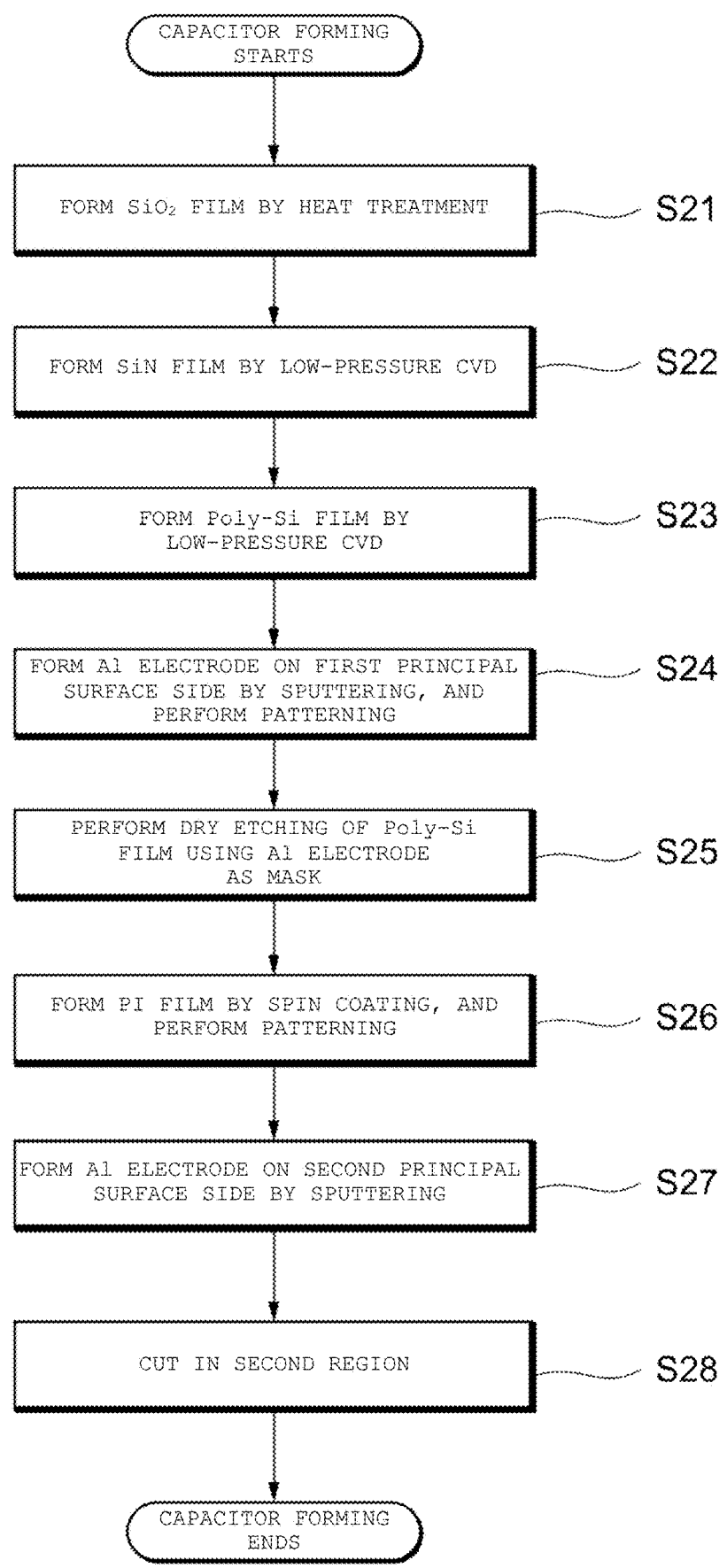
FIG. 5 is a flowchart showing a capacitor forming step in the capacitor manufacturing method according to the second embodiment.
Figure 6:
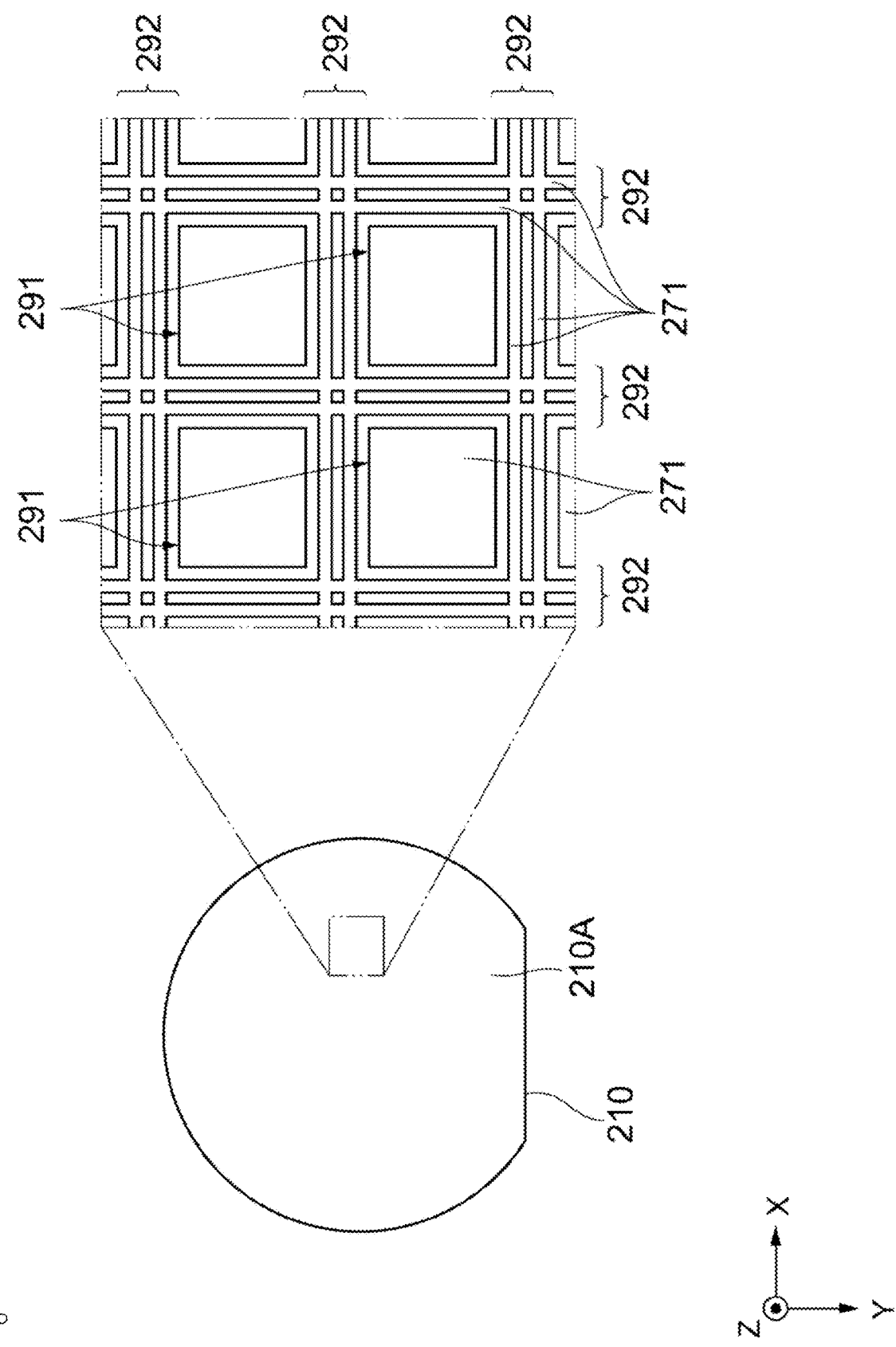
FIG. 6 is a view showing a step of patterning a first photoresist layer shown in FIG. 4.
Figure 7:
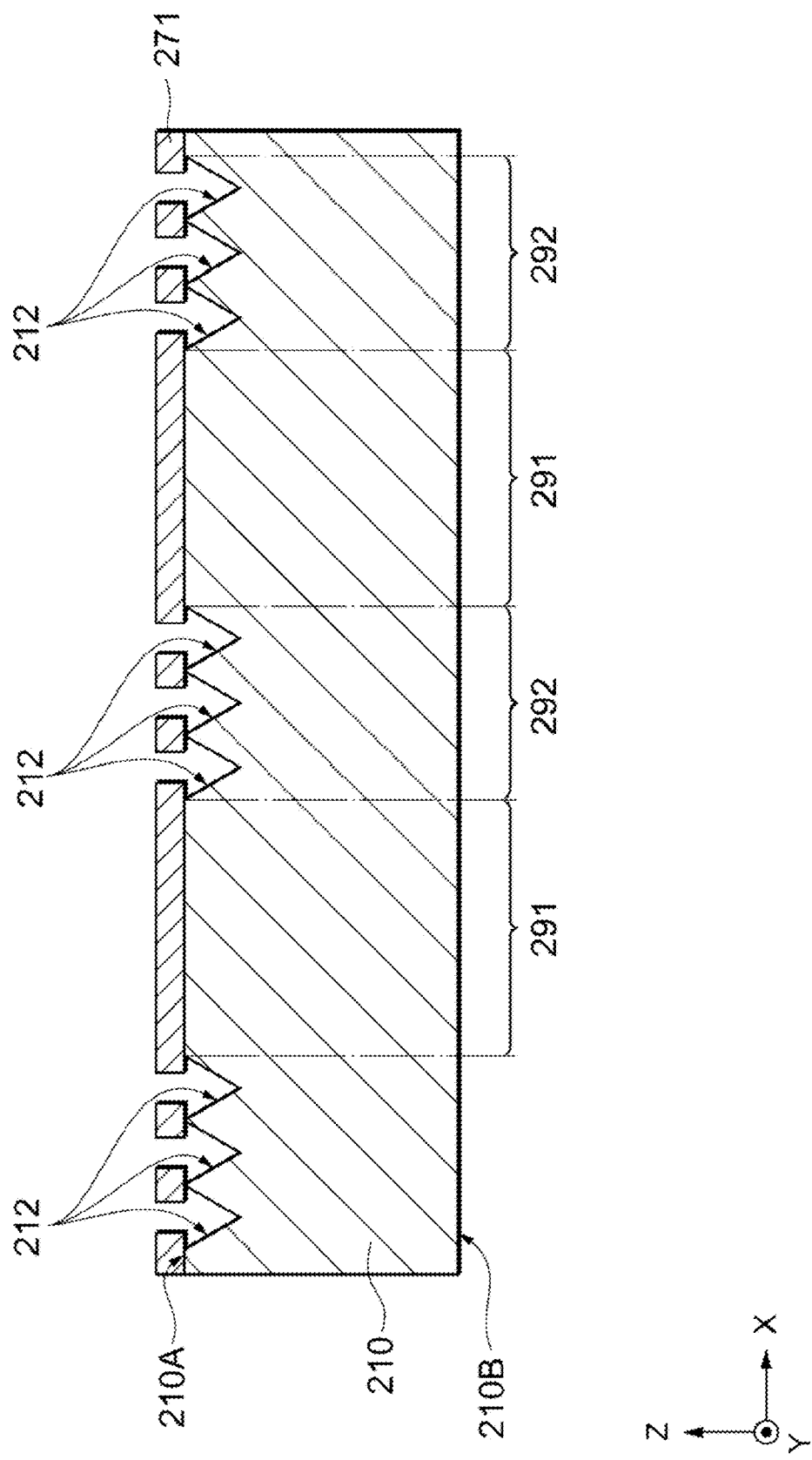
FIG. 7 is a view showing a step of providing a protruding structure portion shown in FIG. 4.
Figure 8:
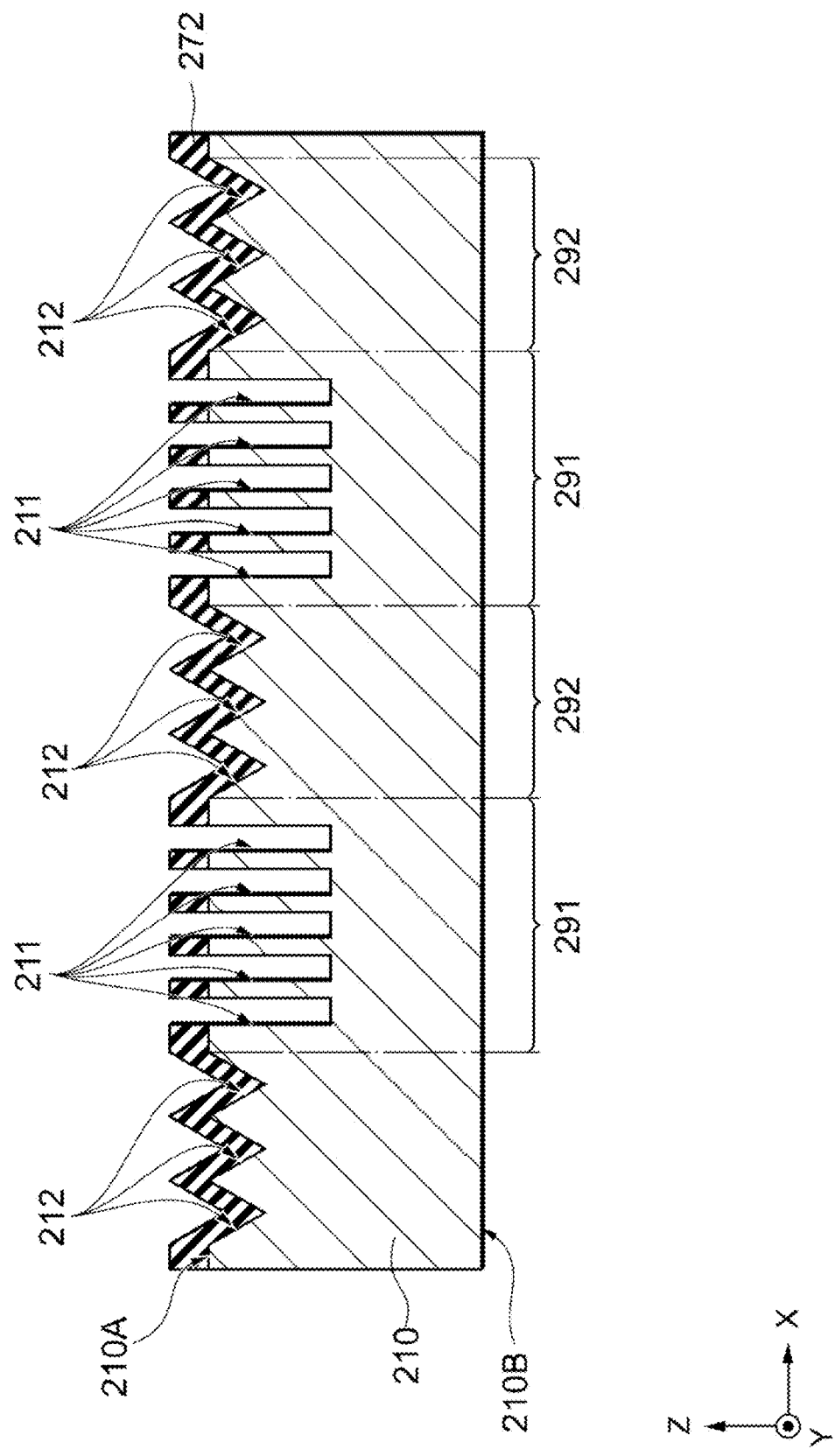
FIG. 8 shows a step of providing a trench structure portion shown in FIG. 4.
Figure 9:
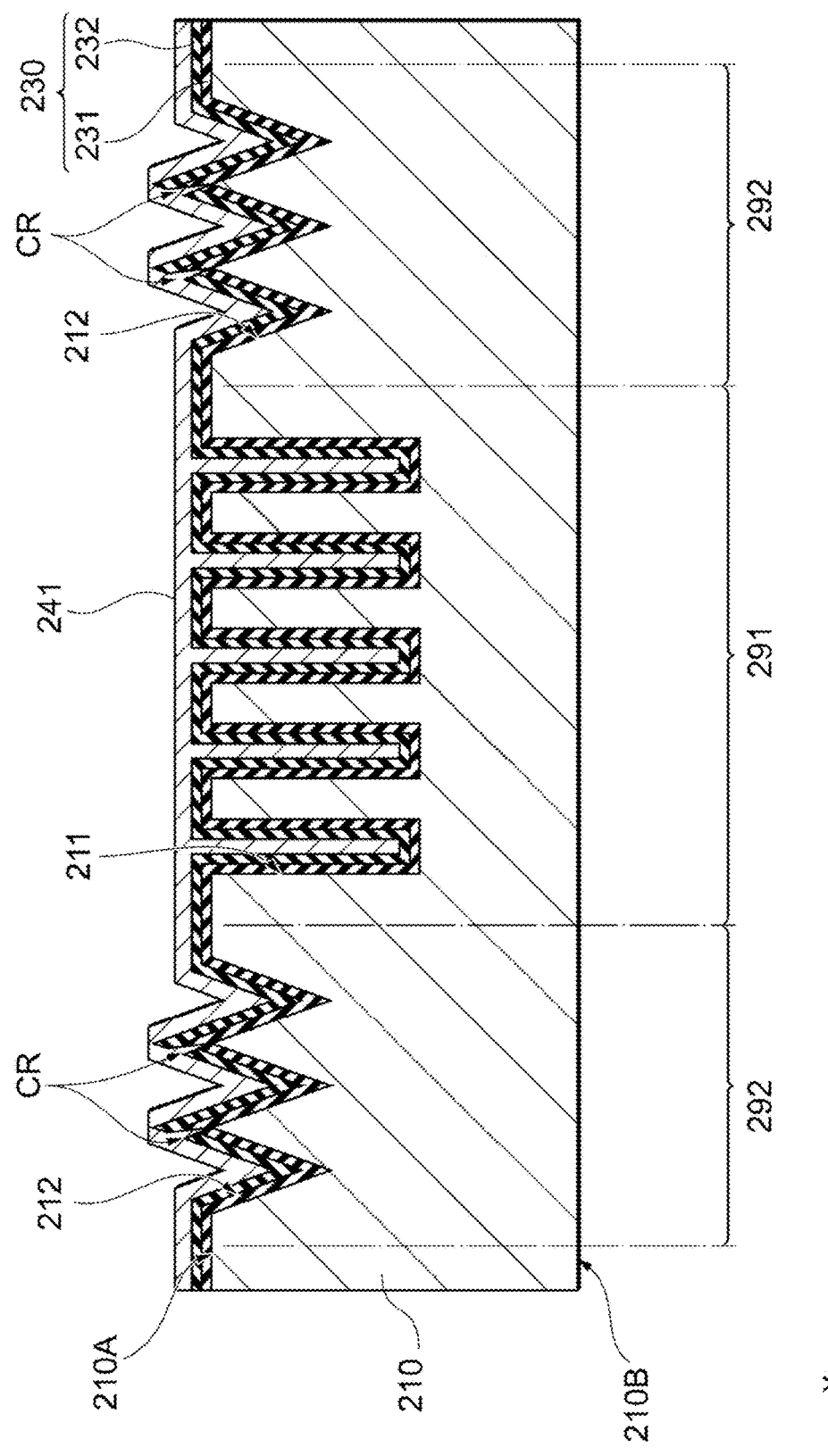
FIG. 9 is a view showing a step of forming a polycrystalline silicon (Poly-Si) film shown in FIG. 5.
Figure 10:
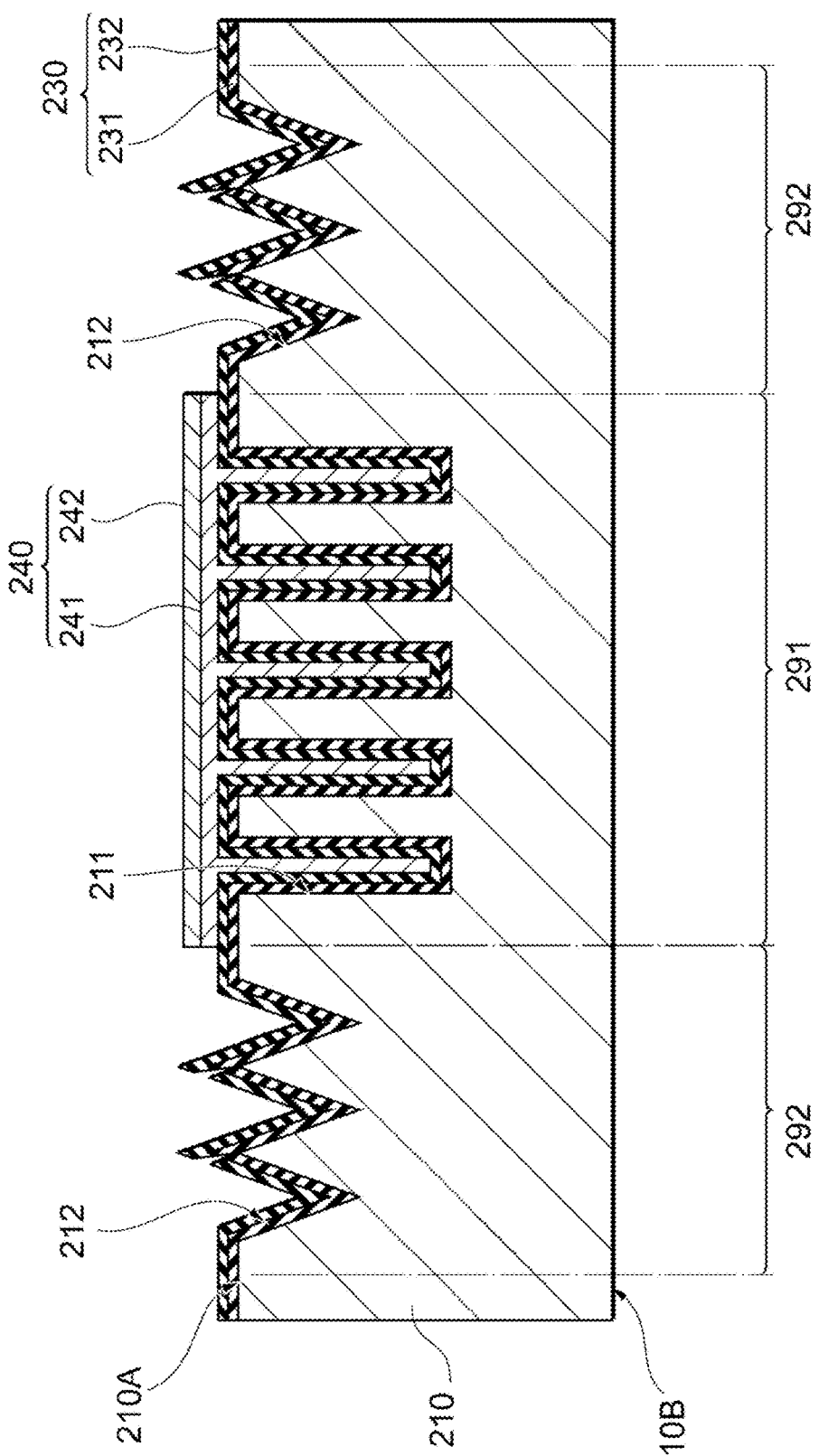
FIG. 10 is a view showing a step of performing dry etching of the Poly-Si film shown in FIG. 5.
Figure 11:
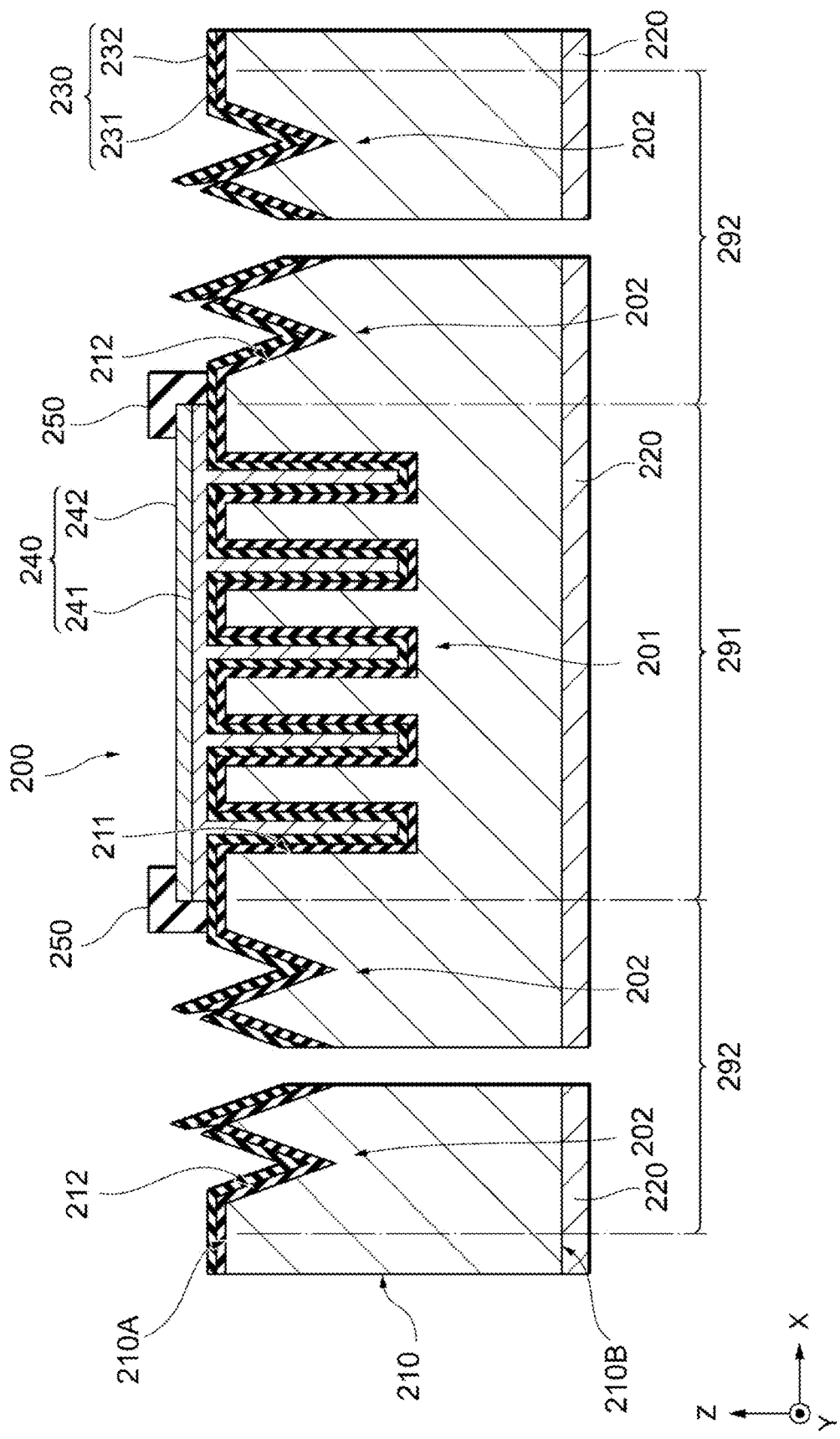
FIG. 11 is a view showing a step of singulating a capacitor shown in FIG. 5.

FIG. 4 is a flowchart showing a substrate processing step in the capacitor manufacturing method according to the second embodiment. FIG. 5 is a flowchart showing a capacitor forming step in the capacitor manufacturing method according to the second embodiment. FIG. 6 is a view showing a step of patterning the first photoresist layer shown in FIG. 4. FIG. 7 is a view showing a step of providing the protruding structure portion shown in FIG. 4. FIG. 8 shows a step of providing the trench structure portion shown in FIG. 4. FIG. 9 is a view showing a step of forming the polycrystalline silicon (Poly-Si) film shown in FIG. 5. FIG. 10 is a view showing a step of performing dry etching of the Poly-Si film shown in FIG. 5. FIG. 11 is a view showing a step of singulating the capacitor shown in FIG. 5. Note that, for convenience of explanation, the substrate processing step and the capacitor forming step are presented as separate steps of the method for manufacturing the capacitor 200. The substrate processing step is a step of forming a trench structure portion and a recess structure portion on an aggregate substrate. The capacitor forming step is a step of providing a dielectric film, a second electrode layer, and the like on an aggregate substrate, and providing a capacitance forming portion of a MIM (Metal-Insulator-Metal) capacitor.

First, the substrate processing step will be described with reference to FIG. 4. In the substrate processing step, first, a low-resistance silicon substrate is prepared (S11). As shown in FIG. 6, a low-resistance silicon substrate 210 corresponds to an aggregate substrate. The low-resistance silicon substrate 210 has a plurality of first regions 291 and a second region 292 between the plurality of first regions 291 when viewed in a plan view from the normal direction of a principal surface 210A. The first region 291 is arranged in a matrix shape in the first direction X and the second direction Y, and the second region 292 is positioned in a lattice shape.

Next, a first photoresist layer is pattern-formed (S12). A first photoresist layer 271 corresponds to a mask provided on the first principal surface 210A of the low-resistance silicon substrate 210 in order to form a recess structure portion 212. As shown in FIG. 6, the first photoresist layer 271 is patterned so as to cover the first region 291. The first photoresist layer 271 is patterned in two parallel strips in the second region 292. That is, between the two adjacent first regions 291 in the first direction X, there are two regions covered with the first photoresist layer 271, and there are three regions opposed to an opening of the first photoresist layer 271. The number of the strip-shaped first photoresist layers 271 parallel to each other in the second region 292 is not limited, and at least one may be patterned.

Next, the recess structure portion is formed by wet etching (S13). As shown in FIG. 6, the low-resistance silicon substrate 210 is cut by wet etching using the first photoresist layer 271 as a mask and potassium hydroxide solution as an etching solution to form a recess structure portion 212. When the crystal is cut by chemical etching such as wet etching, anisotropy of the etching rate is caused by the crystal orientation. The wet etching proceeds such that a crystal plane is formed by the anisotropy of the etching rate. Since the crystal orientation of the first principal surface 210A of the low-resistance silicon substrate 210 is expressed as <100>, etching proceeds so that a surface inclined with respect to the first principal surface 210A is formed, and the recess structure portion 212 having a shape in which acute valleys are alternately continuous are formed.

Next, the first photoresist layer is removed and a second photoresist layer is pattern-formed (S14). After the formation of the recess structure portion 212, the first photoresist layer 271 is removed from the first principal surface 210A of the low-resistance silicon substrate 210 by asking, for example. Thereafter, a second photoresist layer 272 is provided on the first principal surface 210A side of the low-resistance silicon substrate 210, and is patterned. The second photoresist layer 272 corresponds to a mask for providing the trench structure portion 211.

Then, the trench structure portion is formed by reactive ion etching (RIE) (S15). As shown in FIG. 8, the low-resistance silicon substrate 210 is cut by deep dry etching by RIE using the second photoresist layer 272 as a mask. In the RIE, the anisotropy of the etching rate is smaller than that in the wet etching, and etching with a high aspect ratio can proceed from the opening of the second photoresist layer 272 in a direction substantially orthogonal to the first principal surface 210A. Thus, the recess portion of the trench structure portion 211 can be formed to be deeper than the recess portion of the recess structure portion 212.

Next, the second photoresist layer is removed (S16). The second photoresist layer 272 is removed by asking, for example. The low-resistance silicon substrate 210 is rinsed with a rinsing liquid made of, for example, ultrapure water to clean the first principal surface 210A, the trench structure portion 211, and the recess structure portion 212. Thus, the substrate processing step is completed.

Next, the capacitor forming step will be described with reference to FIG. 5. In the capacitor forming step, first, an $SiO_2$ film is formed by heat treatment (S21). For example, the surface of the low-resistance silicon substrate 210 is thermally oxidized by heat treatment at 800° C. to 1100° C. to form an $SiO_2$ film 231. The $SiO_2$ film 231 corresponds to the first dielectric layer 131 of the capacitor 100 according to the first embodiment.

Next, an SiN film is formed by low-pressure CVD (LP-CVD) (S22). As shown in FIG. 9, an SiN film 232 is provided on the $SiO_2$ film 231. The SiN film 232 is grown by thermally reacting a reaction gas composed of $SiH_2Cl_2$ (dichlorosilane) and $NH_3$ (ammonia) on the $SiO_2$ film 231 at a temperature of the low-resistance silicon substrate 210 of 650° C. to 800° C. under a low-pressure environment. When the low-resistance silicon substrate 210 heated for growing the SiN film 232 is cooled, thermal stress is applied to the SiN film 232 because the thermal expansion coefficients of the low-resistance silicon substrate 210 and the SiN film 232 are different. Since the thermal expansion coefficient of the SiN film 232 is larger than that of the low-resistance silicon substrate 210, the SiN film 232 is subjected to tensile stress in the cooling process. Therefore, as shown in FIG. 9, the crack CR is formed in portions of the SiN film 232 that are provided on the recess structure portion 212. The crack CR alleviates the thermal stress applied to the SiN film 232 and suppresses the occurrence of a crack in a portion provided on the trench structure portion 211. The SiN film 232 corresponds to the second dielectric layer 132 of the capacitor 100 according to the first embodiment. That is, the dielectric film 230 is formed of the $SiO_2$ film 231 and the SiN film 232.

Next, a Poly-Si (polycrystalline silicon) film is formed by low-pressure CVD (S23). As shown in FIG. 9, a Poly-Si film 241 is provided on the SiN film 232. The Poly-Si film 241 is grown by thermally reacting a reaction gas composed of $SiH_4$ (silane) at a temperature of the low-resistance silicon substrate 210 of 550° C. to 650° C. under a low-pressure environment. In Step S23, thermal stress is applied to the SiN film 232 in the heating process and the cooling process of the low-resistance silicon substrate 210. That is, the crack CR may be formed in Step S23. The Poly-Si film 241 corresponds to the first conductive layer 141 of the capacitor 100 according to the first embodiment.

Next, an Al (aluminum) electrode is formed on the first principal surface side by sputtering, and patterning is performed (S24). An Al electrode 242 is provided on the entire surface of the Poly-Si film 241. Thereafter, it is patterned by wet etching using photolithography and cut leaving a portion provided on the trench structure portion 211. The Al electrode 242 corresponds to the second conductive layer 142 of the capacitor 100 according to the first embodiment. That is, the second electrode layer 240 is formed by the Poly-Si film 241 and the Al electrode 242.

Next, the Al electrode is used as a mask, and dry etching of the Poly-Si film is performed (S25). The Poly-Si film 241 is cut by a self-aligned process. That is, the Poly-Si film 241 is processed into the same shape as the shape of the Al electrode 242 when viewed in a plan view from the normal direction of the first principal surface 210A of the low-resistance silicon substrate 210.

Next, a PI (polyimide) film is formed by spin coating, and patterning is performed (S26). A PI film 250 is first formed by coating the entire surfaces of the SiN film 232 and the Al electrode 242 exposed on the first principal surface 210A side of the low-resistance silicon substrate 210. Next, the PI film 250 is cut by etching using photolithography, with a portion covering the end portion of the second electrode layer 240 remained. The method for forming the PI film 250 is not particularly limited, and may be, for example, drawing by a dispenser method or pattern formation by a printing method such as screen printing. The PI film 250 corresponds to the insulating film 150 of the capacitor 100 according to the first embodiment.

Next, an Al electrode is formed on the second principal surface side by sputtering (S27). An Al electrode 220 is formed on a second principal surface 210B of the low-resistance silicon substrate 210. The Al electrode 220 is provided in the same manner as the Al electrode 242. The Al electrode 220 corresponds to the first electrode layer 120 of the capacitor 100 according to the first embodiment.

Next, cutting is performed in the second region (S28). That is, as shown in FIG. 11, the low-resistance silicon substrate 210 is cut together with the Al electrode 220, the SiO$_2$ film 231, and the SiN film 232 in the second region 292, and singulated in the portion including the first region 291. The cutting is performed along the center portion of the second region 292. That is, the second region 292 includes a dicing line. A first portion 201, corresponding to a capacitance forming portion for forming a capacitance, is formed in the first region 291, and a second portion 202, corresponding to a stress concentration portion for concentrating stress of the SiN film 232, is formed in the second region 292 having been cut. As a result, the capacitor 200, having the first portion 201 and the second portion 202 outside the first portion 201, is cut out.

Third Embodiment

Figure 12:
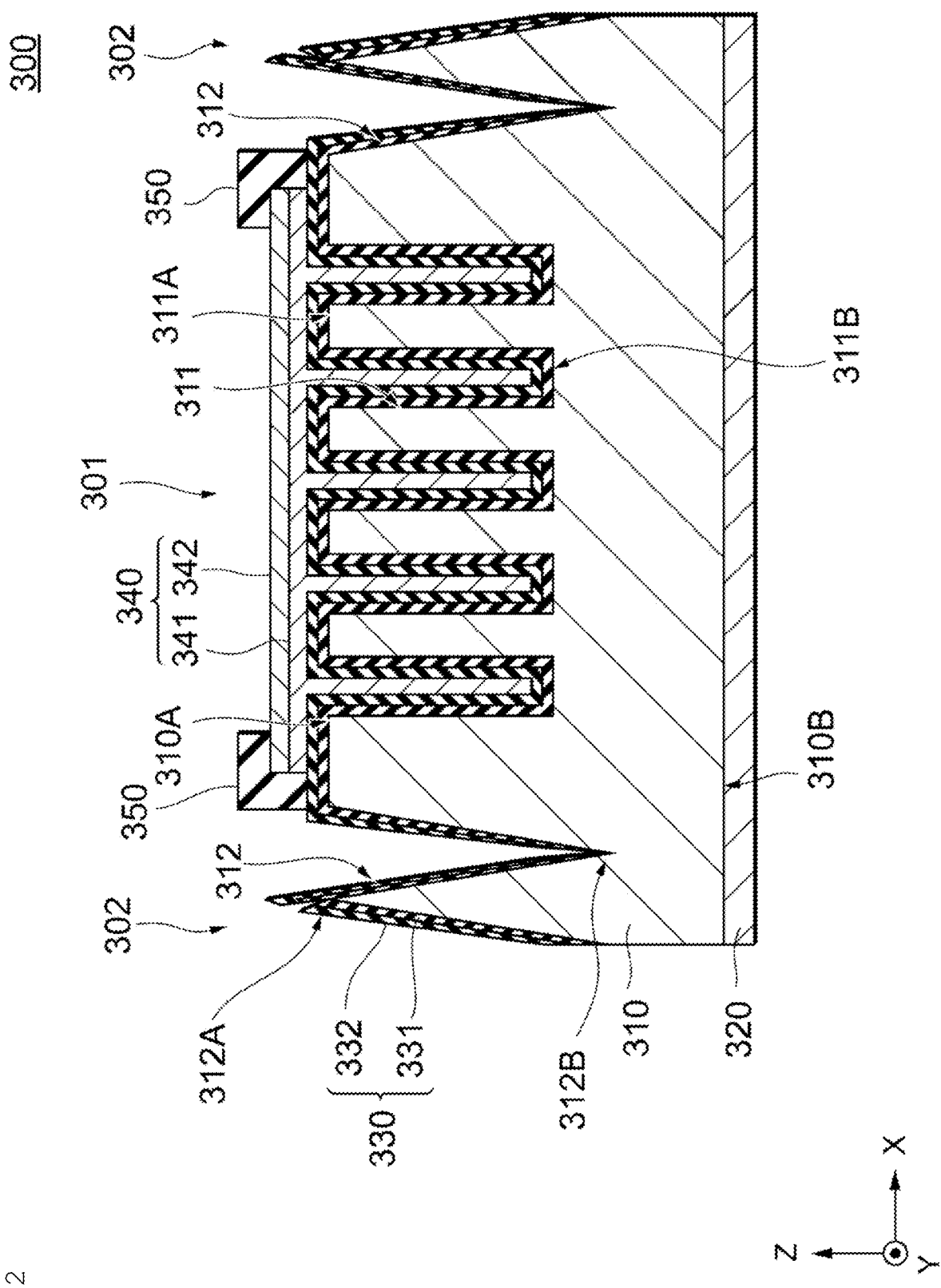
FIG. 12 is a sectional view schematically showing a configuration of a capacitor according to the second embodiment.

As the third embodiment, the configuration of a capacitor 300 will be described with reference to FIG. 12. FIG. 12 is a sectional view schematically showing the configuration of a capacitor according to the second embodiment. Also in the third embodiment described below, as in the second embodiment, description of matters common to the first embodiment and the second embodiment will be omitted and only differences will be described. In particular, no reference will be made one by one to the same actions and effects of the same configuration. The same reference numerals as those in the first embodiment denote the same structures and functions as those in the first embodiment.

The capacitor 300 according to the third embodiment is different from the capacitor 100 according to the first embodiment in that a recess structure portion 312 is formed deeper with respect to a first principal surface 310A of a substrate 310 than a trench structure portion 311. Specifically, the bottom portion of a recess portion 312B of the recess structure portion 312 is closer to a second principal surface 310B of the substrate 310 than the bottom surface of a recess portion 311B of the trench structure portion 311.

As described above, according to one aspect of the present invention, it is provided the capacitor 100 including: the substrate 110 having the principal surface 110A; the dielectric film 130 provided on the principal surface 110A side of the substrate 110; and the electrode layer 140 provided on the dielectric film 130, the substrate 110 has a recess structure portion 112 constituted with at least one recess portion formed in a region outside a region overlapping the electrode layer 140 when viewed in a plan view from a normal direction of the principal surface 110A of the substrate 110, and the dielectric film 130 is provided on the recess structure portion 112.

According to the above aspect, the thermal stress applied to the dielectric film can be concentrated in a portion provided on the recess structure portion. That is, such a capacitor is capable of alleviating the thermal stress in the portion of the dielectric film between the substrate and the electrode layer, and capable of suppressing the occurrence of performance degradation due to leakage current caused by a crack in the dielectric film and operation failure due to short circuit.

The substrate may have the trench structure portion 111 formed in a region overlapping the electrode layer 140 when viewed in a plan view from the normal direction of the principal surface 110A of the substrate 110, and the dielectric film 130 may be provided on the trench structure portion 111. According to this, the area of the capacitance forming portion where the trench structure portion forms a capacitance can be increased, and the capacitance value of the capacitor can be improved. Further, although the trench structure portion tends to cause a crack in the dielectric film in a region overlapping the recess portion or the protrusion portion, the formation of the recess structure portion can suppress the occurrence of a crack in the portion of the dielectric film between the substrate and the electrode layer.

The recess structure portion 112 may be formed so as to surround a region overlapping the electrode layer 140 when viewed in a plan view from the normal direction of the principal surface 110A of the substrate 110. This can alleviate in all directions the thermal stress applied to the dielectric film in the region where the dielectric film overlaps the electrode, and can suppress the occurrence of a crack in the region of the dielectric film between the substrate and the electrode layer.

The recess structure portion 112 may include a plurality of the recess portions 112B and may have the protrusion portion 112A positioned between the recess portions 112B. According to this, since thermal stress is concentrated in the dielectric film at the corner of the recess portion and the protrusion portion of the recess structure portion, the number of the recess portions and the protrusion portions is increased, so that the concentration of thermal stress into the region overlapping the recess structure portion is facilitated, and the thermal stress can be further alleviated in the region overlapping the electrode layer.

The angle θ21, formed on the substrate 110 side by the corner of the protrusion portion 112A of the recess structure portion 112, may be smaller than the angle θ11, formed on the substrate 110 side by the corner of the protrusion portion 111A of the trench structure portion 111. This can cause the thermal stress of the dielectric film to be concentrated more in the protrusion portion of the recess structure portion than in the protrusion portion of the trench structure portion. That is, the thermal stress can be alleviated in the region overlapping the electrode layer.

The angle θ22, formed on the opposite side of the substrate 110 by the corner of the recess portion 112B of the recess structure portion 112, may be smaller than the angle θ12, formed on the opposite side of the substrate 110 by the corner of the recess portion 111B of the trench structure portion 111. This can cause the thermal stress of the dielectric film to be concentrated more in the recess portion of the recess structure portion than in the recess portion of the trench structure portion. That is, the thermal stress can be alleviated in the region overlapping the electrode layer.

The minimum angle of the angle θ21, formed on the substrate 110 side by the corner of the protrusion portion 112A in the recess structure portion 112, and the angle θ22, formed on the opposite side to the substrate 110 by the corner of the recess portion 112B, may be smaller than the minimum angle of the angle θ11, formed on the substrate 110 side by the corner of the protrusion portion 111A in the trench structure portion 111, and the angle θ12, formed on the opposite side to the substrate 110 by the corner of the recess portion 111B. This can cause the thermal stress of the dielectric film to be concentrated more in the recess portion and the protrusion portion of the recess structure portion than in the recess portion or the protrusion portion of the trench structure portion.

The corner of the protrusion portion 112A of the recess structure portion 112 may has an acute angle. This can cause the dielectric film to concentrate the thermal stress more efficiently to the region overlapping the protrusion portion of the recess structure portion.

The depth of at least one recess portion 312B of the recess structure portion 312 with respect to the principal surface 310A may be greater than the depth of the recess portion 311B of the trench structure portion 311 with respect to the principal surface 310A. According to this structure, the recess portion of the recess structure portion can alleviate the thermal stress of the substrate, thereby reducing the warpage of the substrate.

The substrate 110 may have a silicon substrate and the dielectric film 130 may have a silicon nitride. According to this, even if the silicon nitride having a larger thermal expansion coefficient than that of the silicon substrate is formed thick, the dielectric film can alleviate the thermal stress in the region where the dielectric film overlaps the electrode layer. That is, the occurrence of a crack in the silicon nitride film can be suppressed in the region overlapping the electrode layer.

The crystal orientation of the principal surface 110A may be expressed as <100>. According to this, the recess structure portion can be easily formed on the substrate by anisotropic etching such as wet etching.

In the dielectric film 130, the crack CR may be formed in a portion provided on the recess structure portion 112. According to this, the thermal stress on the dielectric film in the direction along the substrate surface is alleviated by the crack. In other words, the dielectric film can alleviate the thermal stress in the region overlapping the electrode layer due to the crack generated in the region overlapping the recess structure portion, thereby reducing the risk of the occurrence of crack.

According to another aspect of the present invention, it is provided a method for manufacturing the capacitor 200, the method including:

a step of preparing the aggregate substrate 210 having the principal surface 210A and having the plurality of first regions 291 and the second region 292 between the plurality of first regions 291 when viewed in a plan view from the normal direction of the principal surface 210A;

a step of forming the recess structure portion 212 constituted with at least one recess portion in the second region 292;

a step of providing the dielectric film 230 on the aggregate substrate 210 in the plurality of first regions 291 and the recess structure portion 212;

a step of providing the electrode layer 240 on the dielectric film 230 in the plurality of first regions 291; and a step of singulating the plurality of first regions 291 by cutting the aggregate substrate 210 in the second region 292.

According to the above aspect, the thermal stress applied to the dielectric film can be concentrated in a portion provided on the recess structure portion in the second region. That is, such a capacitor is capable of alleviating the thermal stress applied to the dielectric film between the substrate and the electrode layer in the first region, and capable of suppressing the occurrence of performance degradation due to leakage current caused by a crack in the dielectric film and operation failure due to short circuit. Further, by providing the recess structure portion in the dicing line of the aggregate substrate, it is not necessary to provide a space for providing the recess structure portion in the capacitor, and the capacitor can be miniaturized.

The method may further include a step of forming the trench structure portion 211 in the plurality of first regions 291, and the dielectric film 230 may be provided on the trench structure portion 211. According to this, the area of the capacitance forming portion where the trench structure portion forms a capacitance can be increased, and the capacitance value of the capacitor can be improved. Further, although the trench structure portion tends to cause a crack in the dielectric film in a region overlapping the recess portion or the protrusion portion, the formation of the recess structure portion can suppress the occurrence of a crack in the portion of the dielectric film between the substrate and the electrode layer.

The corner of the protrusion portion of the recess structure portion 212 may be smaller than the corner of the protrusion portion of the trench structure portion. This can cause the thermal stress of the dielectric film to be concentrated more in the protrusion portion of the recess structure portion than in the protrusion portion of the trench structure portion. That is, the thermal stress can be alleviated in the region overlapping the electrode layer.

The corner of the protrusion portion of the recess structure portion 212 may has an acute angle This can cause the dielectric film to concentrate the thermal stress more efficiently to the region overlapping the protrusion portion of the recess structure portion.

The depth of the recess portion of the recess structure portion 212 with respect to the principal surface 210A may be greater than the depth of the recess portion of the trench structure portion 211 with respect to the principal surface 210A. According to this structure, the recess portion of the recess structure portion can alleviate the thermal stress of the substrate, thereby reducing the warpage of the substrate.

The aggregate substrate 210 may have a silicon substrate and the dielectric film 230 may have a silicon nitride. According to this, even if the silicon nitride having a larger thermal expansion coefficient than that of the silicon substrate is formed thick, the dielectric film can alleviate the thermal stress in the region where the dielectric film overlaps the electrode layer. That is, the occurrence of a crack in the silicon nitride film can be suppressed in the region overlapping the electrode layer.

The crystal orientation of the principal surface 210A may be expressed as <100>, and the step of providing the recess structure portion 212 may include wet etching. According to this, the recess structure portion can be easily formed on the substrate by anisotropic etching such as wet etching.

The method may further include a step of forming the crack CR in a portion provided on the recess structure portion 212 in the dielectric film 230. According to this, the thermal stress on the dielectric film in the direction along the surface of the aggregate substrate is alleviated by the crack. In other words, the dielectric film can alleviate the thermal stress in the region overlapping the electrode layer due to the crack generated in the region overlapping the recess structure portion, thereby reducing the risk of the occurrence of crack.

As described above, according to one aspect of the present invention, it is possible to provide a capacitor capable of improving reliability.

Note that the embodiments described above are intended to facilitate understanding of the present invention, and are not intended to be construed as limiting the invention. The present invention may be modified/improved without departing from the scope thereof, and the present invention also includes equivalents thereof. That is, embodiments modified as appropriate by a person skilled in the art are also within the scope of the present invention as long as they possess the features of the present invention. For example, each element of each embodiment and its arrangement, material, condition, shape, size, and the like are not limited to those illustrated, and may be changed as appropriate. The elements of each embodiment may be combined as far as technically possible, and combinations thereof are also within the scope of the present invention as long as they possess the features of the present invention.

DESCRIPTION OF REFERENCE SYMBOLS

100: Capacitor
101: First portion
102: Second portion
110: Substrate
110A: First principal surface
110B: Second principal surface
111: Trench structure portion
112: Recess structure portion
111A, 112A: Protrusion portion
111B, 112B: Recess portion
θ11, θ12, θ21, θ22: Angle
120: First electrode layer
130: Dielectric film
131: First dielectric layer
132: Second dielectric layer
140: Second electrode layer
141: First conductive layer
142: Second conductive layer
150: Insulating film

The invention claimed is:

1. A capacitor, comprising:
a substrate having a principal surface, the substrate having a recess structure portion with at least one recess portion;
a dielectric film on the recess structure portion and the principal surface of the substrate; and
an electrode layer on the dielectric film, the electrode layer being located such that the at least one recess portion is in a second region outside a first region where the electrode layer overlaps the dielectric layer when viewed in a plan view from a normal direction of the principal surface of the substrate,
wherein the substrate has a trench structure portion in the first region, and the dielectric film is on the trench structure portion,
wherein the recess structure portion has a plurality of recess portions and a protrusion portion positioned between the plurality of recess portions, and
wherein a first angle formed on a substrate side by a corner of a protrusion portion of the recess structure portion is smaller than a second angle formed on the substrate side by a corner of a protrusion portion of the trench structure portion.

2. The capacitor according to claim 1, wherein the recess structure portion surrounds the first region.

3. The capacitor according to claim 1, wherein a third angle formed on an opposite side of the substrate by a corner of a recess portion of the recess structure portion is smaller than a fourth angle formed on an opposite side of the substrate by a corner of a recess portion of the trench structure portion.

4. The capacitor according to claim 1, wherein a first minimum angle of the first angle and a third angle formed on an opposite side to the substrate by a corner of the recess portion in the recess structure portion is smaller than a second minimum angle of the second angle and a fourth angle formed on the opposite side to the substrate by a corner of a recess portion in the trench structure portion.

5. The capacitor according to claim 1, wherein the first angle is an acute angle.

6. The capacitor according to claim 1, wherein a first depth of the at least one recess portion of the recess structure portion with respect to the principal surface is greater than a second depth of a recess portion of the trench structure portion with respect to the principal surface.

7. The capacitor according to claim 1, wherein the substrate comprises a silicon substrate and the dielectric film comprises a silicon nitride.

8. The capacitor according to claim 1, wherein a crystal orientation of the principal surface is expressed as <100>.

9. The capacitor according to claim 1, wherein the dielectric film includes a crack in a portion thereof on the recess structure portion.

10. A method for manufacturing a capacitor, the method comprising:
preparing an aggregate substrate having a principal surface and having a plurality of first regions and a second region between the plurality of first regions when viewed in a plan view from a normal direction of the principal surface;
forming a recess structure portion with at least one recess portion in the second region;
providing a dielectric film on the aggregate substrate in the plurality of first regions and the recess structure portion;
providing an electrode layer on the dielectric film in the plurality of first regions;
singulating the plurality of first regions by cutting the aggregate substrate in the second region; and
forming respective trench structure portions in each of the plurality of first regions, wherein the dielectric film is on the respective trench structure portions, wherein the recess structure portion is formed so as to have a plurality of recess portions and a protrusion portion positioned between the plurality of recess portions, and wherein the recess structure portion and the trench structure portion are formed such that a first angle on a substrate side by a corner of a protrusion portion of the recess structure portion is smaller than a second angle on the substrate side by a corner of a protrusion portion of the trench structure portion.

11. The method for manufacturing a capacitor according to claim 10, wherein the recess structure portion is formed so as to surround each of the plurality of first regions.

12. The method for manufacturing a capacitor according to claim 10, wherein the first angle is an acute angle.

13. The method for manufacturing a capacitor according to claim 10, wherein the recess structure portion and the trench structure portion are formed such that a first depth of the at least one recess portion of the recess structure portion with respect to the principal surface is greater than a second depth of a recess portion of the trench structure portion with respect to the principal surface.

14. The method for manufacturing a capacitor according to claim 10, wherein a crystal orientation of the principal surface is expressed as <100>.

15. The method for manufacturing a capacitor according to claim 10, further comprising forming a crack in the dielectric film in a portion thereof on the recess structure portion.

* * * * *